(12) United States Patent
Kim

(10) Patent No.: US 7,535,785 B2
(45) Date of Patent: May 19, 2009

(54) SEMICONDUCTOR MEMORY APPARATUS HAVING PLURALITY OF SENSE AMPLIFIER ARRAYS HAVING DIFFERENT ACTIVATION TIMING

(75) Inventor: Kwang-Seok Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 5 days.

(21) Appl. No.: 11/647,358

(22) Filed: Dec. 29, 2006

(65) Prior Publication Data
US 2008/0002499 A1  Jan. 3, 2008

(30) Foreign Application Priority Data
Jun. 30, 2006  (KR) .................... 10-2006-0060480

(51) Int. Cl.
*G11C 7/00* (2006.01)
(52) U.S. Cl. .................. 365/222; 365/205; 365/230.03; 365/194
(58) Field of Classification Search ................ 365/222, 365/205, 230.03, 194
See application file for complete search history.

(56) References Cited

U.S. PATENT DOCUMENTS

| 4,912,678 A | * | 3/1990 | Mashiko | ...................... 365/222 |
|---|---|---|---|---|
| 5,406,526 A | | 4/1995 | Sugibayashi et al. | |
| 5,726,943 A | * | 3/1998 | Yamagata et al. | ........... 365/222 |
| 6,566,929 B2 | * | 5/2003 | Pyo | ............................ 327/296 |
| 2005/0146972 A1 | | 7/2005 | Hong | |

FOREIGN PATENT DOCUMENTS

| JP | 1130392 | 5/1989 |
|---|---|---|
| JP | 3019198 | 1/1991 |
| JP | 2000331475 | 11/2000 |
| KR | 100234365 | 9/1999 |
| KR | 1020030074129 | 9/2003 |
| KR | 1020060039266 | 5/2006 |

* cited by examiner

*Primary Examiner*—Huan Hoang
(74) *Attorney, Agent, or Firm*—Venable LLP; Jeffri A. Kaminski

(57) ABSTRACT

A semiconductor memory apparatus according to an embodiment of the present invention includes a plurality of cell mats each having a plurality of cells, a plurality of sense amplifier arrays, each having a plurality of sense amplifiers for sensing the cells in response to a power terminal driving signal and a ground terminal driving signal, and a sense amplifier activation control unit that adjusts a timing, at which the sense amplifier arrays are activated, in response to a refresh signal.

4 Claims, 4 Drawing Sheets

SEMICONDUCTOR MEMORY APPARATUS HAVING PLURALITY OF SENSE AMPLIFIER ARRAYS HAVING DIFFERENT ACTIVATION TIMING

BACKGROUND OF THE INVENTION

1. Technical Field

The present invention relates to a semiconductor memory apparatus, in particular, to a semiconductor memory apparatus that includes sense amplifier arrays having different sensing time.

2. Related Art

A unit memory cell that constitutes a DRAM (Dynamic Random Access Memory) has a drawback in that it is difficult to hold stored data for a predetermined time due to a leakage component of the cell itself. In order to compensate for this data leakage, a system performs a refresh operation that enables the memory to restore data for each predetermined time. The refresh operation includes auto-refresh in which a refresh operation is performed during a normal operation and self-refresh in which the memory is kept to perform a minimum operation, thereby reducing power consumption when the system does not operate for a long time.

That is, the refresh operation is a process of amplifying data stored in a cell by a sense amplifier and storing the amplified data in the cell again.

As shown in FIG. 1, a conventional semiconductor memory apparatus includes a plurality of cell mats 10-1 to 10-4 each having a plurality of memory cells; and a plurality of sense amplifier arrays 20-1 to 20-4, each having a plurality of sense amplifiers for sensing data in the memory cells in response to a power terminal driving signal SAP and a ground terminal driving signal SAN.

The semiconductor memory apparatus activates the plurality of sense amplifier arrays 20-1 to 20-4 in response to the power terminal driving signal SAP and the ground terminal driving signal SAN in a refresh mode. Accordingly, the plurality of sense amplifiers that constitute the plurality of sense amplifier arrays 20-1 to 20-4 are also activated and perform the sensing operation, which causes consumption of a large amount of current.

Further, at a timing where the plurality of sense amplifier arrays 20-1 to 20-4 are simultaneously activated, that is, the sense amplifiers that constitute the plurality of sense amplifier arrays 20-1 to 20-4 perform the sensing operation, current consumption is suddenly increased. Accordingly, an erroneous operation in the semiconductor memory apparatus may occur.

Specifically, in the semiconductor memory apparatus according to the related art, in case of a refresh operation, since a plurality of memory cells are simultaneously driven, an excessive current (hereinafter, referred to as 'peak current') instantaneously flows in the semiconductor memory. The peak current causes a drop in the level of external voltage VDD and a bit line precharge voltage VBLP and ground bouncing in a ground voltage VSS. Therefore, there may be a bad effect when the sense amplifiers perform the sensing operation.

SUMMARY OF THE INVENTION

An embodiment of the present invention provides a semiconductor memory apparatus that can reduce a sudden peak current during a refresh operation.

Another embodiment of the present invention provides a semiconductor memory apparatus that can reduce a sudden peak current during a refresh operation by adjusting activation timing of a plurality of sense amplifiers.

According to another embodiment of the present invention, a semiconductor memory apparatus includes a plurality of cell mats each having a plurality of cells, a plurality of sense amplifier arrays, each having a plurality of sense amplifiers for sensing the cells in response to a power terminal driving signal and a ground terminal driving signal, and a sense amplifier activation control unit that adjusts a timing, at which the sense amplifier arrays are activated, in response to the presence or absence of a refresh signal.

DESCRIPTION OF EXEMPLARY EMBODIMENT

Hereinafter, an embodiment of the present invention will now be described in detail with reference to the accompanying drawings.

Figure 1:
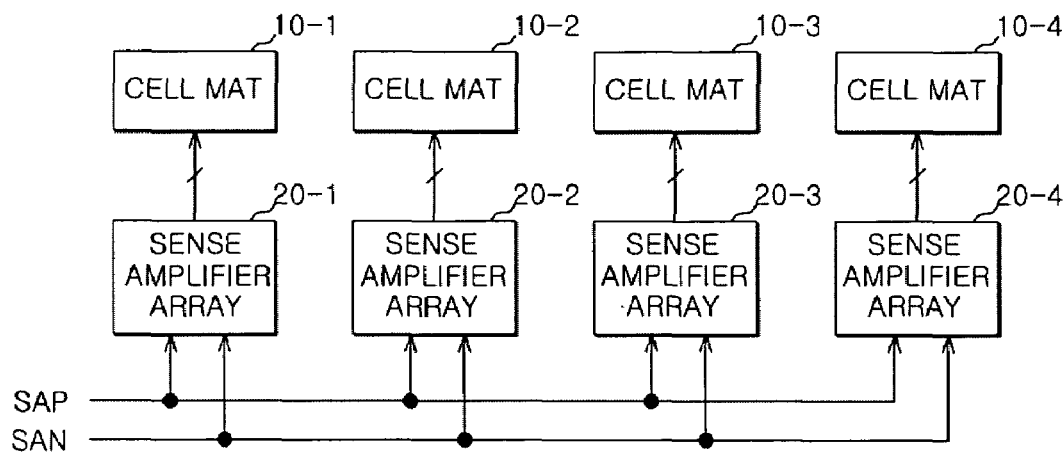
FIG. 1 is a block diagram showing a conventional semiconductor memory apparatus.
Figure 2:
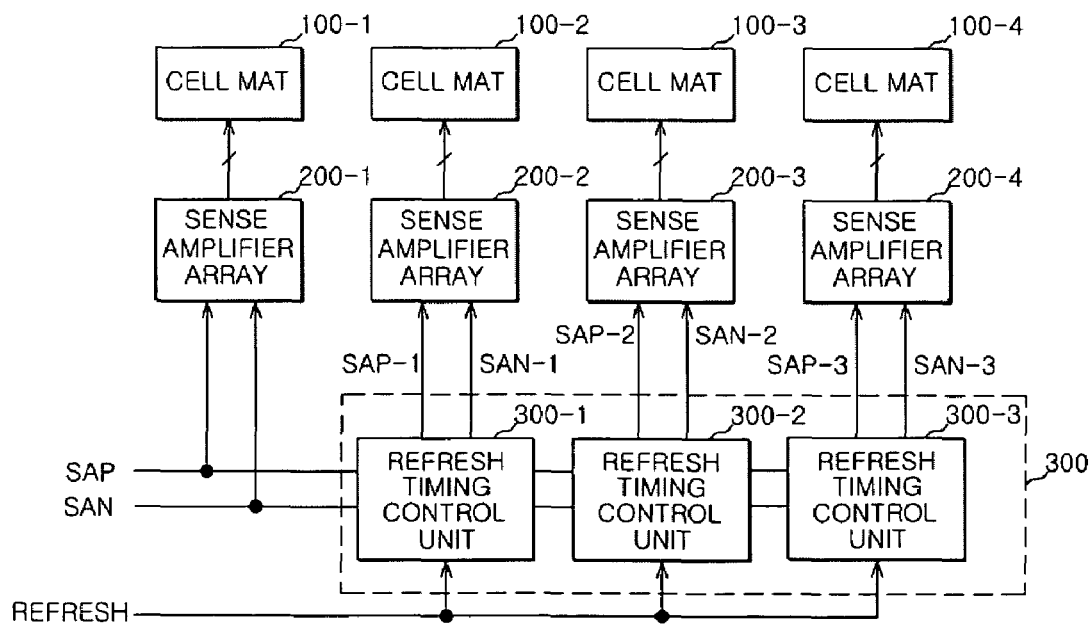
FIG. 2 is a block diagram showing a semiconductor memory apparatus according to an embodiment of the present invention.

Referring to FIG. 2, a semiconductor memory apparatus according to an embodiment of the present invention includes a plurality of cell mats 100-1 to 100-4, a plurality of sense amplifier arrays 200-1 to 200-4 and a sense amplifier activation control unit 300.

Each cell mat 100-1 to 100-4 has a plurality of cells. Each sense amplifier array 200-1 to 200-4 has a plurality of sense amplifiers sensing the cells in response to a power terminal driving signal SAP and a ground terminal driving signal SAN. The sense amplifier activation control unit 300 adjusts a timing, at which the sense amplifier arrays 200-1 to 200-4 are activated, in response to a refresh signal REFRESH.

For example the semiconductor memory apparatus according to the embodiment of the present invention may have four cell mats 100-1 to 100-4 and four sense amplifier arrays 200-1 to 200-4. However, the embodiment is just for efficient explanation, and the present invention is not limited thereto.

The sense amplifier activation control unit 300 includes a plurality of refresh timing control units 300-1 to 300-3 that adjust a timing, at which the power terminal driving signal SAP and the ground terminal driving signal SAN are input to the sense amplifier arrays 200-1 to 200-4, in response to the refresh signal REFRESH.

The power terminal driving signal SAP and the ground terminal driving signal SAN are generated when a sense amplifier enable signal SAEN is activated. In an activation period, the power terminal driving signal SAP is a signal for applying an external voltage VDD or an internal voltage VCORE to a power terminal of the sense amplifier. That is, when the sense amplifier is activated, if an over driving operation is included,(that is, if the operation of sense amplifier includes the over-driving operation of the sense amplifier), the power terminal driving signal SAP may be an over-driving driving signal SAP1 that applies the external voltage VDD to the power terminal of the sense amplifier.

When the sense amplifier is activated, if the activation of the sense amplifier does not includes the over-driving operation, the power terminal driving signal SAP may be an internal power driving signal SAP2 that applies the internal voltage VCORE to the power terminal of the sense amplifier. Further, the ground terminal driving signal SAN is a signal for applying the ground voltage VSS to the ground terminal of the sense amplifier when the sense amplifier is activated.

The refresh signal REFRESH is activated during a refresh mode of the semiconductor memory apparatus. In an embodiment of the present invention, it is assumed that the refresh signal REFRESH is activated when the level of the signal is a logic high.

Figure 3:
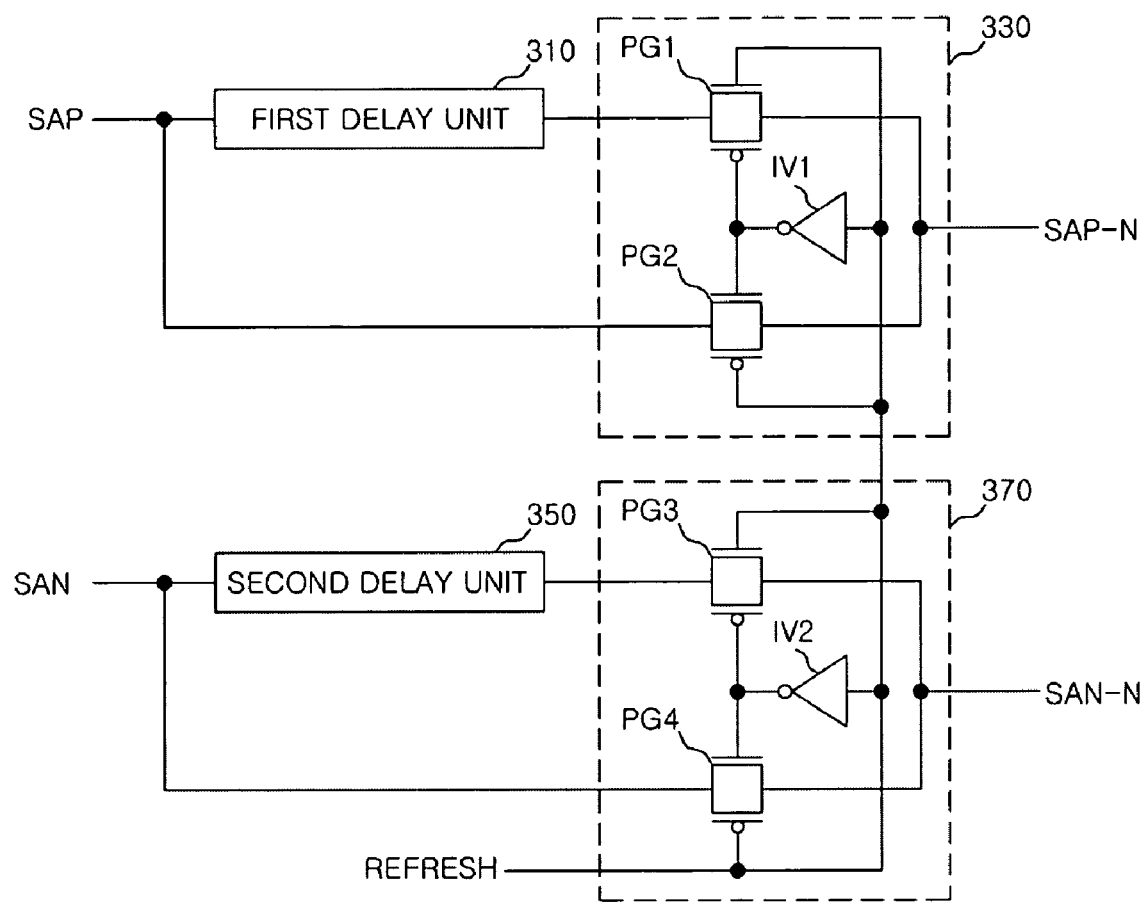
FIG. 3 is a circuit diagram showing the refresh timing control unit shown in FIG. 2.

In FIG. 3 the refresh timing control unit 300-N includes a first delay unit 310, a first switching unit 330, a second delay unit 350, and a second switching unit 370

The first delay unit 310 delays the power terminal driving signal SAP. The first switching unit 330 outputs the power terminal driving signal SAP or an output signal of the first delay unit 310 to the sense amplifier array 200-N+1 in response to the refresh signal REFRESH. The second delay unit 350 delays the ground terminal driving signal SAN, and a second switching unit 370 outputs the ground terminal driving signal SAN or an output signal of the second delay unit 350 to the sense amplifier array 200-N+1 in responses to the refresh signal REFRESH. Here, N is a natural number.

The first switching unit 330 includes a first inverting unit IV1 that inverts the refresh signal REFRESH; a first pass gate PG1 that outputs the output signal of the first delay unit 310 to the sense amplifier arrays 200-2 to 200-4 in response to an output signal of the first inverting unit IV1 and the refresh signal REFRESH; and a second pass gate PG2 that outputs the power terminal driving signal SAP to the sense amplifier array 200-N+1 in response to the output signal of the first inverting unit IV1 and the refresh signal REFRESH.

The second switching unit 370 includes a second inverting unit IV2 that inverts the refresh signal REFRESH, a third pass gate PG3 that outputs an output signal of the second delay unit 350 to the sense amplifier array 200-N+1 in response to an output signal of the second inverting unit IV2 and the refresh signal REFRESH, and a fourth pass gate PG4 that outputs the ground terminal driving signal SAN to the sense amplifier array 200-N+1 in response to the output signal of the second inverting unit IV2 and the refresh signal REFRESH.

The operation of the semiconductor memory apparatus according to an embodiment of the present invention will be described with reference to FIGS. 2 and 3.

In the semiconductor memory apparatus according to an embodiment of the present invention, when the refresh signal REFRESH is not activated, that is, in case of a normal mode, the power terminal driving signal SAP and the ground terminal driving signal SAN are simultaneously input to the sense amplifier arrays 200-1 to 200-4 so as to activate the sense amplifier arrays 200-1 to 200-4 at the same time.

When the refresh signal REFRESH is activated, that is, in the case of the refresh mode, the power terminal driving signal SAP and the ground terminal driving signal SAN are delayed for a predetermined time and then input to the sense amplifier arrays 200-1 to 200-4, respectively, at different times, such that sensing timing of the sense amplifiers in the sense amplifier arrays 200-1 to 200-4 varies.

Specifically, in the case of the normal mode, the refresh signal REFRESH is inactivated and the power terminal driving signal SAP and the ground terminal driving signal SAN are input to the first sense amplifier array 200-1. The power terminal driving signal SAP and the ground terminal driving signal SAN that are input to the refresh timing control units 300-1 to 300-3 are output to the sense amplifier arrays 200-2 to 200-4 with no delay. Therefore, the sense amplifier arrays 200-1 to 200-4 are activated at the same time, such that the sense amplifiers of the sense amplifier arrays 200-1 to 200-4 perform read and write operations of data in the cells of the cell mats 100-1 to 100-4, correspondingly connected to the sense amplifier arrays 200-1 to 200-4, in response to a control signal (read command signal or write command signal).

That is, the signals SAP and SAN to be input to the first sense amplify array 200-1, the signals SAP-1 and SAN-1 to be input to the second sense amplifier array 200-2, the signals SAP-2 and SAN-1 to be input to the third sense amplifier array 200-3, and the signals SAP-3 and SAN-3 to be input to the fourth sense amplifier array 200-4 are input at the same timing.

Meanwhile, in the case of the refresh mode, the refresh signal REFRESH is activated and the first sense amplifier array 200-1 is activated in response to the power terminal driving signal SAP and the ground terminal driving signal SAN so as to refresh the cells of the first cell mat 100-1.

The power terminal driving signal SAP and the ground terminal driving signal SAN, each delayed by a predetermined time, respectively, by the first delay unit 310 and the second delay unit 350 of the first refresh timing control unit 300-1, are input to the second sense amplifier array 200-2. Therefore, the second sense amplifier array 200-2 is activated later than an activation timing of the first sense amplifier array 200-1 by the predetermined time so as to refresh the cells of the second cell mat 100-2 by the predetermined time after the cells of the first cell mat 100-1 are refreshed.

The power terminal driving signal SAP and the ground terminal driving signal SAN delayed by the predetermined time, respectively, by the first refresh timing control unit 300-1 and the second refresh timing control unit 300-2 are input to the third sense amplifier array 200-3. Therefore, the third sense amplifier array 200-3 is activated later than an activation timing of the second sense amplifier array 200-2 by the predetermined time so as to refresh the cells of the third cell mat 100-3 by the predetermined period of time after the cells of the first cell mat 100-1 and the second cell mat 100-2 have been refreshed.

Similarly, the fourth sense amplifier array 200-4 is delayed by the predetermined time after an activation timing of the third sense amplifier array 200-3 so as to refresh the cells of the fourth cell mat 100-4. That is, each of the signals SAP, SAN, SAP-1 to SAP-3, and SAN-1 to SAN-3 is input to the sense amplifier arrays 200-1 to 200-4 at different times.

Figure 4:
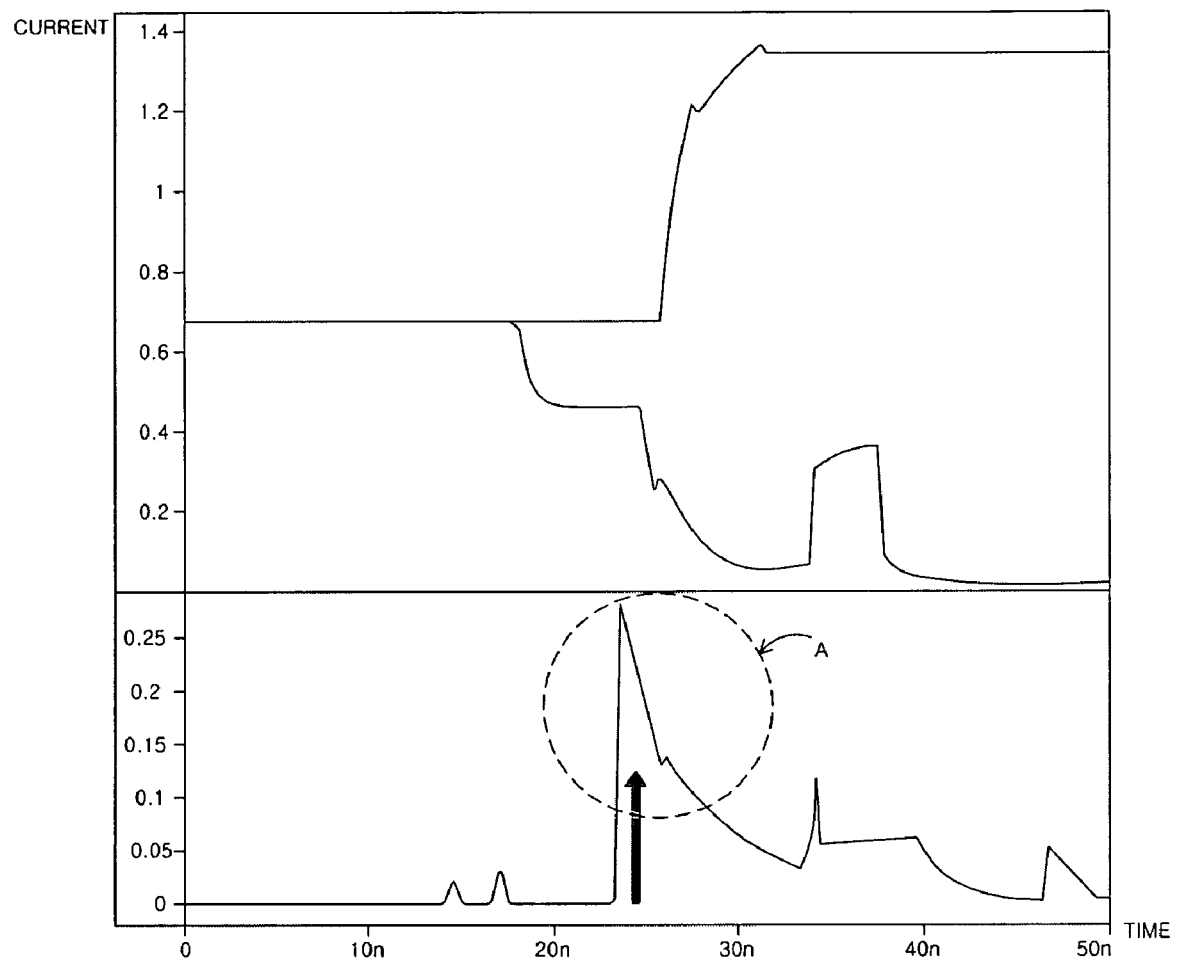
FIG. 4 is a timing chart showing a peak current during a refresh operation in the prior art semiconductor memory apparatus.

FIG. 4 is a timing chart showing a sudden peak current upon the refresh operation in the conventional semiconductor memory apparatus.

As shown in FIG. 4, when the refresh operation is performed, since the sense amplifiers in the semiconductor memory apparatus are activated at the same time, a peak current becomes high in a region A due to an instantaneous increase of a current.

Figure 5:
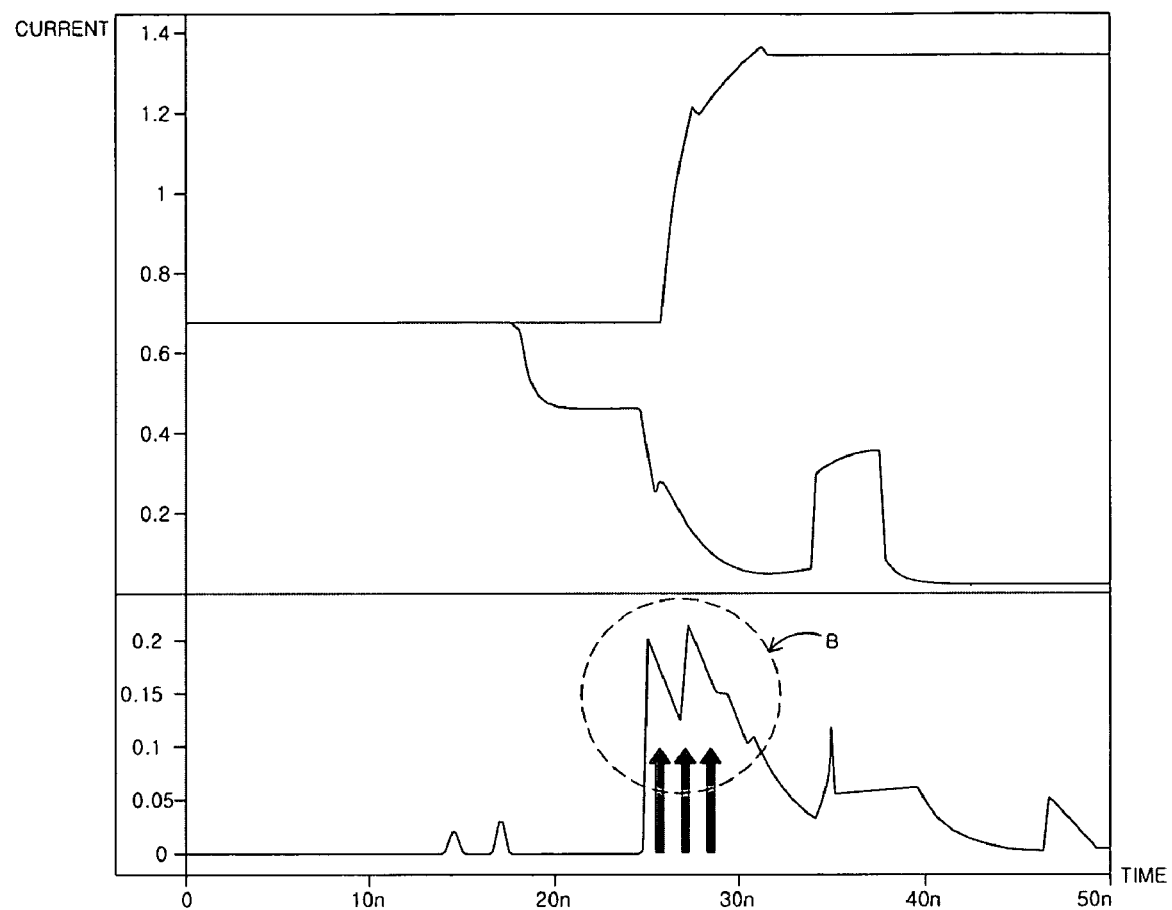
FIG. 5 is a timing chart showing a peak current during a refresh operation in the semiconductor memory apparatus according to an embodiment of the present invention.

FIG. 5 is a timing chart showing a sudden peak current upon the refresh operation in the semiconductor memory apparatus according to an embodiment of the present invention.

As shown in FIG. 5, in a region B, when the refresh operation is performed, the plurality of sense amplifier arrays 200-1 to 200-4, each having the plurality of sense amplifiers, are divided such that the sense amplifier arrays 200-1 to 200-4 are activated at different times. Then, the instantaneous increase of the current is reduced, and the peak current becomes lower.

That is, it can be seen that the peak current in the region A shown in FIG. 4 is higher than the peak current in the region B shown in FIG. 5.

As described above, the semiconductor memory apparatus according to an embodiment of the present invention can reduce the peak current by sequentially delaying the power terminal driving signal SAP and the ground terminal driving signal SAN in response to the refresh signal REFRESH and controlling the plurality of sense amplifier arrays 200-1 to 200-4, each having the plurality of the sense amplifiers, to be activated at different timing.

It will be apparent to those skilled in the art that various modifications and changes may be made without departing from the scope and spirit of the present invention. Therefore, it should be understood that the above embodiments are not limiting, but illustrative in all embodiments. The scope of the present invention is defined by the appended claims rather than by the description preceding them, and therefore all changes and modifications that fall within metes and bounds of the claims, or equivalents of such metes and bounds are therefore intended to be embraced by the claims.

The semiconductor memory apparatus according to an embodiment of the present invention can reduce the peak current by controlling the activation timing of the plurality of sense amplifier arrays to be different from one another such that sense amplifiers in each of the sense amplifier arrays have different sensing timing during the refresh operation.

What is claimed is:

1. A semiconductor memory apparatus comprising:
   a plurality of cell mats each having a plurality of cells;
   a plurality of sense amplifier arrays, each having a plurality of sense amplifiers for sensing a plurality of data of the cells in response to a power terminal driving signal and a ground terminal driving signal; and
   a sense amplifier activation control unit that controls activating timings of the sense amplifier arrays so that each of the sense amplifier arrays is activated, in a refresh mode, wherein the sense amplifier activation control unit includes a plurality of refresh timing control units that adjust a timing, at which the power terminal driving signal and the ground terminal driving signal are input to the sense amplifier arrays, in the refresh mode, wherein each of the refresh timing control units includes:
   a first delay unit that delays the power terminal driving signal;
   a first switching unit that outputs the power terminal driving signal or the output signal of the first delay unit to the sense amplifier array in response to the refresh signal;
   a second delay unit that delays the ground terminal driving signal; and
   a second switching unit that outputs the ground terminal driving signal or the output signal of the second delay unit to the sense amplifier array in the refresh mode.

2. The semiconductor memory apparatus of claim 1, wherein, when the sense amplifiers are activated, if an over-driving operation is included, the power terminal driving signal is an over-driving driving signal and, when the sense amplifiers are activated, if the over-driving operation is not included, the power terminal driving signal is an internal power driving signal.

3. The semiconductor memory apparatus of claim 1, wherein the first switching unit includes:
   a first pass gate that outputs the output signal of the first delay unit to the sense amplifier array in response to the refresh signal; and
   a second pass gate that outputs the power terminal driving signal to the sense amplifier array in response the refresh signal.

4. The semiconductor memory apparatus of claim 1, wherein the second switching unit includes:
   a first pass gate that outputs the output signal of the second delay unit to the sense amplifier array in response to the refresh signal; and
   a second pass gate that outputs the ground terminal driving signal to the sense amplifier array in the refresh mode.

* * * * *